(12) United States Patent
Ahmed et al.

(10) Patent No.: US 10,756,680 B2
(45) Date of Patent: *Aug. 25, 2020

(54) LOW NOISE DIFFERENTIAL AMPLIFIER

(71) Applicant: SEMICONDUCTOR COMPONENTS INDUSTRIES, LLC, Phoenix, AZ (US)

(72) Inventors: Abdullah Ahmed, Scarborough (CA); Jonas Weiland, Del Mar, CA (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/570,213

(22) Filed: Sep. 13, 2019

(65) Prior Publication Data

US 2020/0007089 A1 Jan. 2, 2020

Related U.S. Application Data

(63) Continuation of application No. 15/909,098, filed on Mar. 1, 2018, now Pat. No. 10,491,166.

(51) Int. Cl.
*H03F 1/26* (2006.01)
*H03F 3/45* (2006.01)
*H03F 1/02* (2006.01)

(52) U.S. Cl.
CPC .......... *H03F 1/26* (2013.01); *H03F 3/45179* (2013.01); *H03F 2200/135* (2013.01); *H03F 2200/165* (2013.01); *H03F 2200/21* (2013.01); *H03F 2200/267* (2013.01); *H03F 2200/294* (2013.01); *H03F 2200/297* (2013.01); *H03F 2200/387* (2013.01); *H03F 2203/45031* (2013.01); *H03F 2203/45084* (2013.01); *H03F 2203/45116* (2013.01); *H03F 2203/45118* (2013.01);

(Continued)

(58) Field of Classification Search
USPC ................................................. 330/252–261
See application file for complete search history.

(56) References Cited

U.S. PATENT DOCUMENTS 9,847,762 B1 12/2017 Nagulapalli et al.
2008/0001665 A1 1/2008 Wyatt
(Continued)

FOREIGN PATENT DOCUMENTS

TW 200501553 A 1/2005

OTHER PUBLICATIONS

IEEE Journals & Magazine, "A 1-V 450-nW Fully Integrated Programmable Biomedical Sensor Interface Chip", vol. 44, Issue 4, Apr. 2009; retrieved from the Internet at http://ieeexplore.ieee.org/document/4805128/?part=1.

*Primary Examiner* — Hieu P Nguyen
(74) *Attorney, Agent, or Firm* — Brake Hughes Bellermann LLP

(57) ABSTRACT

In one general aspect, an amplifier can include an input amplifier circuit configured to receive a bias current and receive, as an input, a signal pair connected differentially to the input amplifier circuit, the input amplifier circuit configured to output a differential output signal pair based on the received differential input signal pair, a feedback amplifier circuit configured to receive an average of the differential output signal pair and configured to provide a bias setting output for controlling the bias current, and an output buffer circuit configured to buffer the differential output signal pair, the buffering resulting in a buffered differential output signal pair capable of driving a resistive load.

20 Claims, 12 Drawing Sheets

(52) U.S. Cl.
CPC .............. *H03F 2203/45151* (2013.01); *H03F 2203/45244* (2013.01)

(56) References Cited

U.S. PATENT DOCUMENTS

| | | |
|---|---|---|
| 2008/0068038 A1 | 3/2008 | Cranford, Jr. et al. |
| 2009/0108936 A1 | 4/2009 | Forejt |
| 2009/0133083 A1 | 5/2009 | Klein et al. |
| 2013/0069728 A1 | 3/2013 | Fan |
| 2019/0028061 A1 | 1/2019 | Yeh et al. |

LOW NOISE DIFFERENTIAL AMPLIFIER

CROSS-REFERENCE TO RELATED APPLICATION

The present application is a continuation of U.S. application Ser. No. 15/909,098 filed on Mar. 1, 2018, which is incorporated herein by reference in its entirety.

TECHNICAL FIELD

This description generally relates to a low noise differential amplifier.

BACKGROUND

In general, small electronic devices, for example electronic medical devices that can be worn or implanted in a person, can benefit significantly in some applications from reductions in size and/or power consumption. However, reducing size and/or power consumption may be challenging because relatively large and high power components are needed to achieve the high sensitivity and selectivity when processing signals in body worn electronics. Accordingly, known body worn electronic devices are not capable of achieving desirable sensitivity and selectivity for processing of bio-signals while being sufficiently small and low-power.

SUMMARY

In one general aspect, an amplifier includes a feedback amplifier circuit configured to control an output voltage swing of a output differential signal pair in relation to a bias current by providing a constant output voltage signal gain for the output differential signal pair, an input amplifier circuit configured to receive the bias current and configured to receive, as an input, a signal pair connected differentially to the input amplifier circuit through a blocking capacitor, the input amplifier circuit configured to output the output differential signal pair based on the input differential signal pair and the bias current, and an output buffer including a first buffer circuit and a second buffer circuit, the first buffer circuit configured to amplify a first output signal of the differential output signal pair to generate an first buffered output signal configured to drive a first resistive load, the second buffer circuit configured to amplify a second output signal of the differential output signal pair to generate a second buffered output signal configured to drive a second resistive load.

Implementations can include one or more of the following features, alone or in combination with one or more other features. For example, the amplifier can further include a DC bias module configured to set a high pass filter frequency for the amplifier. The DC bias module can include a plurality of resistors and a plurality of metal oxide semiconductor (MOS) transistors controlling the plurality of resistors for setting a DC bias for the input differential signal pair. The high pass filter frequency can be further based on a value of the blocking capacitor. The feedback amplifier circuit can be a common mode feedback circuit. The feedback amplifier circuit can have an input voltage that is a first common mode reference voltage and the DC bias module can have an input voltage that is a second common mode reference voltage. A value of the first common mode reference voltage and a value of the second common mode reference voltage can be set in order to control an input common mode range for the amplifier. The amplifier can be a pre-amplifier having a first stage that includes the feedback amplifier circuit and the input amplifier circuit, and having a second stage that includes the output buffer, and the first resistive load and the second resistive load are included in a gain module. A plurality of metal oxide semiconductor (MOS) transistors can control a switching of output load resistors to the input amplifier circuit. The output load resistors can have a value determining a magnitude of current for consumption by the input amplifier circuit. The magnitude of current consumed can determine a level of noise in the amplifier. The amplifier can have a common mode gain that is determined based on a matching of the output load resistors. The feedback amplifier can have an input that is a combination of a second output signal voltage of the output differential signal pair and a first output signal voltage of the output differential signal pair. The amplifier can further include an input bias current module configured to generate the bias current and provide the bias current to the input amplifier. The feedback amplifier can have an output controlling the generating of the bias current by the input bias current module.

In another general aspect, a method can include receiving, by an input amplifier circuit included in an amplifier, an input differential signal pair and a bias current, outputting, by the input amplifier circuit, an output differential signal pair based on the received input differential signal pair and the received bias current, receiving, by a feedback amplifier circuit included in the amplifier, a combination of the signals of the output differential signal pair, and outputting, by the feedback amplifier circuit, a signal for controlling the bias current.

Implementations can include one or more of the following features, alone or in combination with one or more other features. For example, the method can further include controlling, by a plurality of metal oxide semiconductor (MOS) transistors, a switching of output load resistors to the input amplifier circuit, determining a value of the output load resistors based on the switching, determining an amount of current for consumption by the input amplifier circuit based on the determined value of the output load resistors, and determining a level of noise in the amplifier based on the determined amount of current consumed by the amplifier. The method can further include determining a common mode gain of the amplifier based on a matching of the output load resistors. The method can further include receiving, by an input bias current module included in the amplifier, the signal for controlling the generating of the bias current from the feedback amplifier circuit, generating, by the input bias current module, the bias current based on the received signal, and outputting, by the input bias current module, the bias current for input to the input amplifier circuit. The bias current can be determined based on a value set for a second common mode reference voltage. The method can further include determining a value for a first common mode reference voltage fi or us in controlling a signal swing of the output differential signal pair.

In yet another general aspect, an amplifier can include an input amplifier circuit configured to receive a bias current and receive, as an input, a signal pair connected differentially to the input amplifier circuit, the input amplifier circuit configured to output a differential output signal pair based on the received differential input signal pair, a feedback amplifier circuit configured to receive an average of the differential output signal pair and configured to provide a bias setting output for controlling the bias current, and an output buffer circuit configured to buffer the differential output signal pair, the buffering resulting in a buffered differential output signal pair capable of driving a resistive load.

Implementations can include one or more of the following features, alone or in combination with one or more other features. For example, the amplifier can further include a combining circuit configured to receive the differential output signal pair and configured to output the average of the differential output signal pair for input to the feedback amplifier. The bias setting output can be based on a value set for a second common mode reference voltage. The feedback amplifier circuit can control a voltage swing of the differential output signal pair based on the bias setting output. The voltage swing of the differential output signal pair can be controlled based on setting a value for a first common mode reference voltage. The amplifier can provide a constant gain based on the controlling of the voltage swing by the feedback amplifier circuit. The amplifier can be a pre-amplifier. The pre-amplifier can have a first stage that includes the feedback amplifier circuit and the input amplifier circuit. The pre-amplifier can have a second stage that includes the output buffer. The resistive load can be included in a gain module.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like elements.

DETAILED DESCRIPTION

Figure 1A:
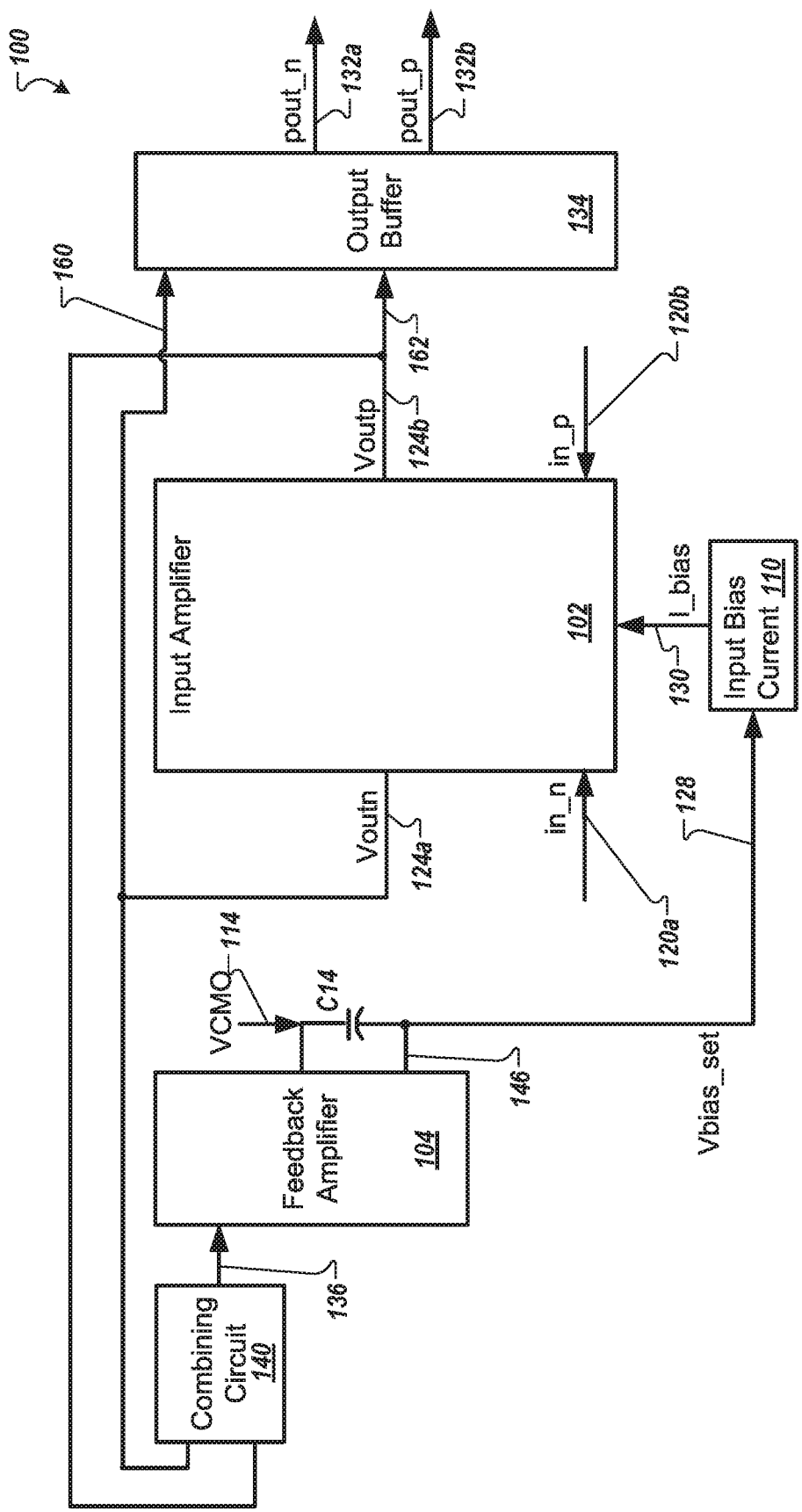
FIG. 1A is a block diagram showing example electrical circuitry for an integrated differential amplification circuit.

Small and low-power electronic devices, such as electronic medical devices, that can be worn by a person and/or implanted in a person (both of which can be referred to as body worn electronics or body worn electronic devices) can be beneficial in a variety of applications. Electronic circuits included in these small, low-powered body worn electronics can include signal processing circuits that consume a limited amount of power (e.g., less than one microwatt) while delivering a high common-mode rejection ratio (CMRR) and/or a low total harmonic distortion (THD) of amplified signals. An integrated differential amplification circuit, as discussed herein, for amplifying signals in such circuits can satisfy the low power consumption requirement while delivering a high CMRR and a low THD of amplified signals.

In some body worn electronic device applications, for example, pre-amplification of biological and/or audio input signals by an amplification circuit with a high-pass corner frequency (e.g., a high-pass cut-off frequency, a high-pass break frequency) at low frequencies can be implemented. In general, signal processing within a first stage of a front end of an amplification circuit may be dominated by noise. Therefore, the requirements of the amplification circuit to amplify an input signal while keeping noise and other signal distortions to a minimum can be important for the front end of the amplification circuit because any noise or other type of signal distortion introduced at the front end of the amplification circuit can degrade the performance of the electronic circuit as a whole. The noise and/or signal distortion may be further amplified and provided to other circuits included in the body worn electronic device. The integrated differential amplification circuit, as discussed herein, includes the use of differential inputs to the first stage of the front end of the amplification circuit providing the advantage of improved noise and interference resistance.

The integrated differential amplification circuit as discussed herein provides, for example, an amplification circuit that is a low-power circuit suitable for component matching that can tightly control a high-pass corner frequency for the integrated differential amplification circuit. The integrated differential amplification circuits described herein have advantages over, for example, the use of discrete components. Implementing an amplification circuit in discrete components can result in increased power consumption, restricted noise/current consumption tradeoffs, difficulties when matching components, and a high-pass corner frequency (e.g., a high-pass cut-off frequency, a high-pass break frequency) which may not be well-controlled.

The example integrated differential amplification circuit described herein can include a self-biased common-mode feedback which can be fed forward to tightly control a voltage in the gain stage of the amplification circuit. The voltage produces a current in a sub-threshold gain stage of the amplification circuit where the gain of the gain stage is proportional to the current and is controlled by the voltage fed into the gain stage. Implementing a constant gain in the gain stage can include the ability to trade input referred noise for current drain resulting in the ability to scale current consumption with noise as a trade-off. This provides the advantage of maintaining a stable operating point for the amplification circuit.

Though the example integrated differential amplification circuit described herein can be used in body worn electronics or body worn electronic devices, the example integrated differential amplification circuit described herein may also be used in other types of small, low-powered electronic devices that include signal processing circuits that consume a limited amount of power while delivering a high CMRR and/or a low THD of amplified signals.

FIG. 1A is a block diagram showing example electrical circuitry for an integrated differential amplification circuit. An amplifier 100 can include a combining circuit 140, a feedback amplifier 104 (which may also be referred to as a feedback amplifier circuit 104), an input amplifier 102 (which may also be referred to as an input amplifier circuit 102), an input bias current module 110, and an output buffer 134.

The amplifier 100 can be used for signal processing in, for example, body worn electronics. The amplifier 100 can provide pre-amplification of, for example, a bio-signal and/or an audio signal (e.g., input differential signal pair 120a-b shown as input signal in_n 120a and input signal in_p 120b). The input signal in_p 120b is the voltage supplied to the non-inverting input of the input amplifier 102. The input signal in_n 120a is the voltage supplied to the inverting input of the input amplifier 102.

The amplifier 100 can amplify the input differential signal pair 120a-b using a high common-mode rejection ratio feedback amplifier (e.g., feedback amplifier 104), an input amplifier (e.g., input amplifier 102), and an output buffer 134. The amplified input differential signal pair is output from the amplifier 100 as a buffered output differential signal pair 132a-b shown as buffered output signal pout_n 132a and buffered output signal pout_p 132b. The buffered output signal pout_n 132a is the voltage output from the inverting output of the output buffer 134. The buffered output signal pout_p 132b is the voltage output from the non-inverting output of the output buffer 134.

The feedback amplifier 104 is provided with a combination of an output differential signal pair 124a-b shown as output signal Voutn 124a and output signal Voutp 124b. For example, the combination of the output differential signal pair 124a-b can be the average (or midpoint) of the output signal Voutn 124a and the output signal Voutp 124b. The average or combination of the output differential signal pair 124a-b is input as an input signal 136 to the feedback amplifier 104. The output differential signal pair 124a-b are output signals from the input amplifier 102. The output signal Voutn 124a is the voltage output from the inverting output of the input amplifier 102. The output signal Voutp 124b is the voltage output from the non-inverting output of the input amplifier 102.

An output 146 of the feedback amplifier 104 controls an input to an input bias current module 110 (e.g., Vbias_set 128). An output (e.g., I_bias 130) of the input bias current module 110 is input to the input amplifier 102. The output I_bias 130 controls the bias current for the input amplifier 102.

Figure 3:
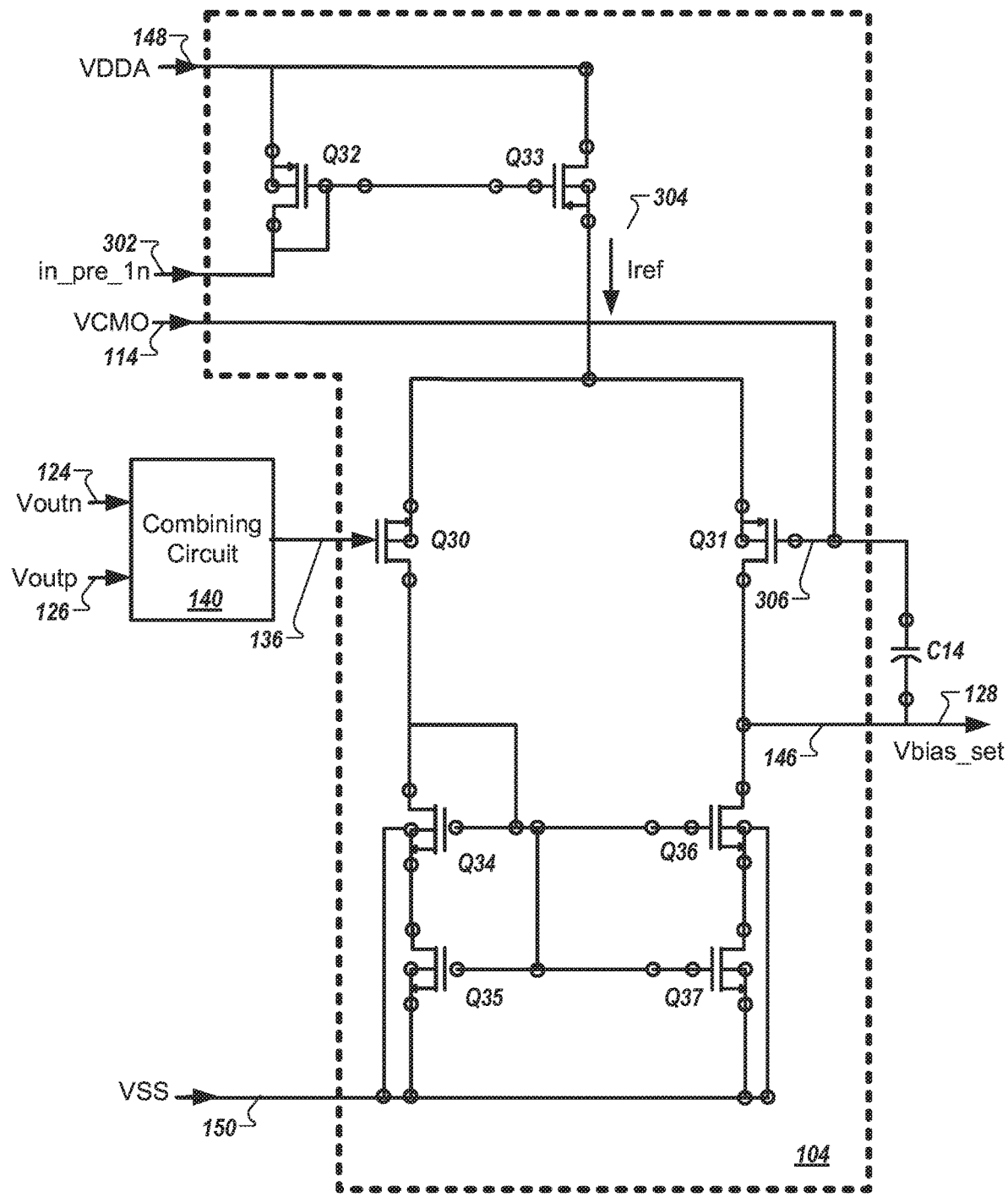
FIG. 3 is a diagram showing example electrical circuitry for a feedback amplifier.

Referring to FIG. 3, a second common mode reference voltage Vcmo 114 is connected to a gate 306 of MOS transistor Q31. Capacitor C14, which is connected (coupled) between the gate 306 of the MOS transistor Q31 and output 146, can improve the stability of the feedback circuit 104 as shown in FIG. 3. The Vbias_set 128 input signal voltage is the result of the feedback amplifier 104 sensing and equalizing the input signal 136, which can be the average (or midpoint) of the output signal Voutn 124 voltage and the output signal Voutp 124b voltage. A value of the Vbias_set 128 input signal voltage can be generated to control the output current current, I_bias 130, from the input bias current module 110, shown in more detail in FIG. 7.

The amplifier 100 can have one or more advantages when incorporated as a pre-amplifier in, for example, body worn electronics. Use of differential inputs for the input amplifier 102 can provide improved noise and interference resistance. Any noise or electromagnetic interference is common to both the input signal in_n 120a and input signal in_p 120b. Because the input amplifier 102 measures the difference between the input signal in_n 120a and input signal in_p 120b any noise or electromagnetic interference is ignored. Use of the feedback amplifier 104 providing control of the bias current for input to the input amplifier 102 based on the combination or average of the output differential signal pair 124a-b from the input amplifier 102 can maintain a stable operating point for the pre-amplifier by maintaining a constant gain for the input amplifier 102 by controlling the signal swing of the output differential signal pair 124a-b in relation to the input bias current.

In order to maintain the current for the input amplifier 102 low (at a minimum value (e.g., in the nanoamphere range)), an output resistance for each of the output signal Voutn 124a and the output signal Voutp 124b is large (e.g., in the megaOhm range). Because of the large output resistance of the output signal Voutn 124a and the output signal Voutp 124b, the output signal Voutn 124a and the output signal Voutp 124b may not drive a resistive load. The use of an output buffer (e.g., the output buffer 134) can buffer the output signal Voutn 124a and the output signal Voutp 124b, generating the buffered output signal pout_n 132a and buffered output signal pout_p 132b as outputs of the pre-amplifier that are configured to drive a resistive load.

Figure 1B:
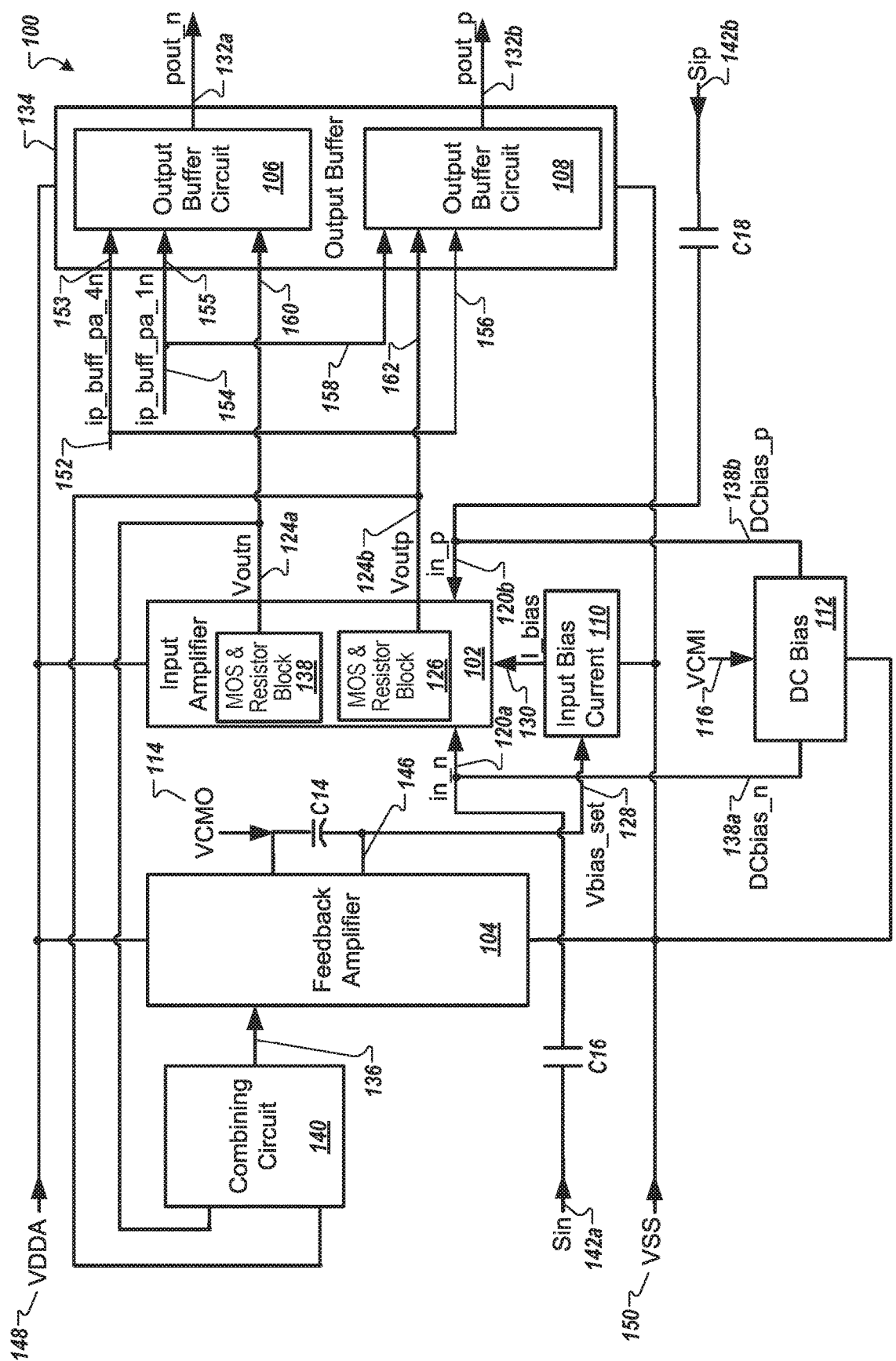
FIG. 1B is a block diagram showing example electrical circuitry for an amplifier that includes a feedback amplifier, an input amplifier, an input bias current module, a DC bias module, and an output buffer.

FIG. 1B is a block diagram showing, in more detail, example electrical circuitry for the amplifier 100 that further includes a DC bias module 112, a first output buffer circuit 106 and a second output buffer circuit 108 included in the output buffer 134, and a metal oxide semiconductor (MOS) transistor and resistor block 126 and a MOS transistor and resistor block 138 included in the input amplifier 102.

Figure 9:
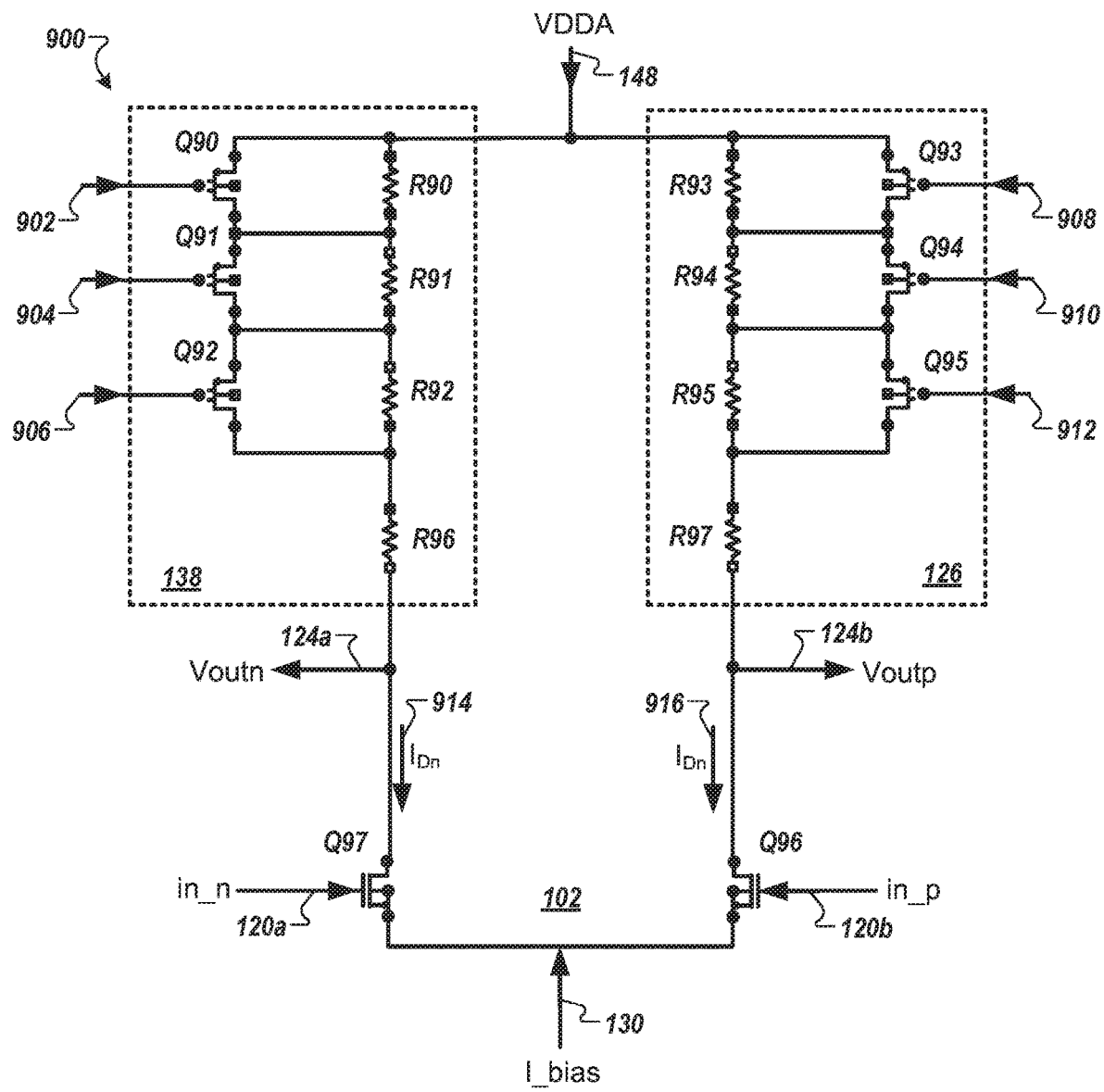
FIG. 9 is a diagram showing example electrical circuitry for an input amplifier.

Details of the circuitry included in the MOS transistor and resistor block 126 and the MOS transistor and resistor block 138 are shown in FIG. 9. In general, each MOS transistor and resistor block includes a plurality of MOS transistors that can switch respective resistors in and out of a circuit that can control the gain of a respective output signal (e.g., the output signal Voutn 124a and the output signal Voutp 124b). A total resistance value can be increased or decreased in a tradeoff of gain verse noise for the respective output signal. The DC bias module 112 outputs a DC bias differential voltage signal 138a-b shown as DCbias_n 138a and DCbias_p 138b) for use in controlling the DC bias of the input differential signal pair 120a-b, the input signal in_n 120a and the input signal in_p 120b, respectively. A first common mode reference voltage Vcmi 116 is provided as the input reference voltage to the DC bias module 112. Capacitor C16 and capacitor C18 can be used to set a high pass filter frequency for the input signal in_n 120a and the input signal in_p 120b, the input differential signal pair 120a-b. Voltage Sin 142a and voltage Sip 142b are reference voltages provided to the capacitor C16 and the capacitor C18, respectively, as a reference voltage differential signal pair 142a-b.

The output signal Voutn 124a is provided to the first output buffer circuit 106 as input signal 160. The first output buffer circuit 106 buffers the output signal Voutn 124a from the input amplifier 102 for output as buffered output signal pout_n 132a. The output signal Voutp 124b is provided to the second output buffer circuit 108 as input signal 162. The second output buffer circuit 108 buffers the output signal Voutp 124b from the input amplifier 102 for output as buffered output signal pout_p 132b. The first output buffer circuit 106 and the second output buffer circuit 108 provide the buffered output differential signal pair 132a-b.

For example, the combining circuit 140 provides the input signal 136 to the feedback amplifier 104 as an average of the output signal Voutn 124a and output signal Voutp 124b.

VDDA 148 is a regulated supply voltage for the amplifier 100. For example, VDDA 148 can be of a low value in the one volt range. In some implementations, the VDDA 148 can be a regulated battery voltage. VSS 150 is a circuit ground voltage for the amplifier 100.

An ip_buff_pa_4n signal 152 and an ip_buff_pa_1n signal 154 are provided to the first output buffer 106 as input signal 153 and input signal 155, respectively. The ip_buff_pa_4n signal 152 and the ip_buff_pa_1n signal 154 are provided to the second output buffer 108 as input signal 156 and input signal 158, respectively. The ip_buff_pa_4n signal 152 and the ip_buff_pa_1n signal 154 are used by the first output buffer circuit 106 and the second output buffer circuit 108 when buffering the output signal Voutn 124a and the output signal Voutp 124b, respectively, to produce the buffered output signal pout_n 132 and the buffered output signal pout_p 132b, respectively.

In some implementations, the amplifier 100 can have two stages, a first stage 170 and a second stage 172. The first stage 170 can include the feedback amplifier 104, the input amplifier 102, the combining circuit 140, the input bias current module 110, and the DC bias module 112. The second stage 172 can include the output buffer 134.

The low current consumption, however, can limit the drive capability of the output differential signal pair 124a-b (shown as the output signal Voutn 124a and the output signal Voutp 124b) for driving output loads. A resistive load subsequent gain stage can be provided by the output buffer 134. The output buffer 134 can include output buffer circuits (the first output buffer circuit 106 and the second output buffer circuit 108, respectively) for buffering the output signal Voutn 124a and the output signal Voutp 124b. The first output buffer circuit 106 and the second output buffer circuit 108 included in the output buffer 134 can be a high-slew rate buffer configured (designed) to provide low total harmonic distortion. For example, for maximum input signal levels of two millivolts peak, the total harmonic distortion produced by the amplifier 100 can be less than one percent. The first output buffer circuit 106 and the second output buffer circuit 108 included in the output buffer 134 can be implemented (designed) as a source follower with low output impedance that can buffer each output signal from the input amplifier 102. The first output buffer circuit 106 and the second output buffer circuit 108 included in the output buffer 134, therefore, can be implemented such that the amplifier 100 can exhibit a class AB performance using a simple structure.

Figure 4:
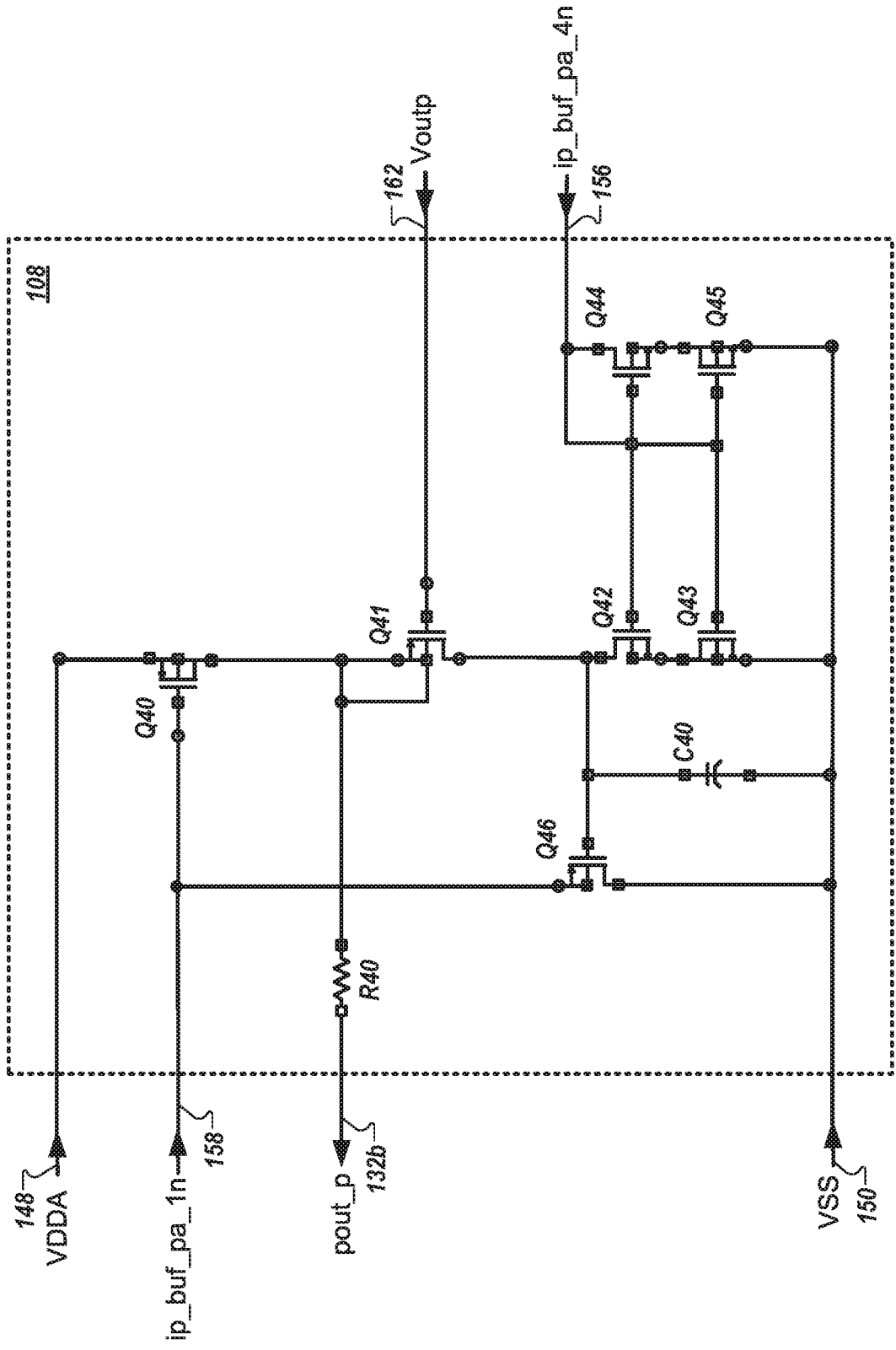
FIG. 4 is a diagram showing example electrical circuitry included in a first circuit included in an output buffer.
Figure 5:
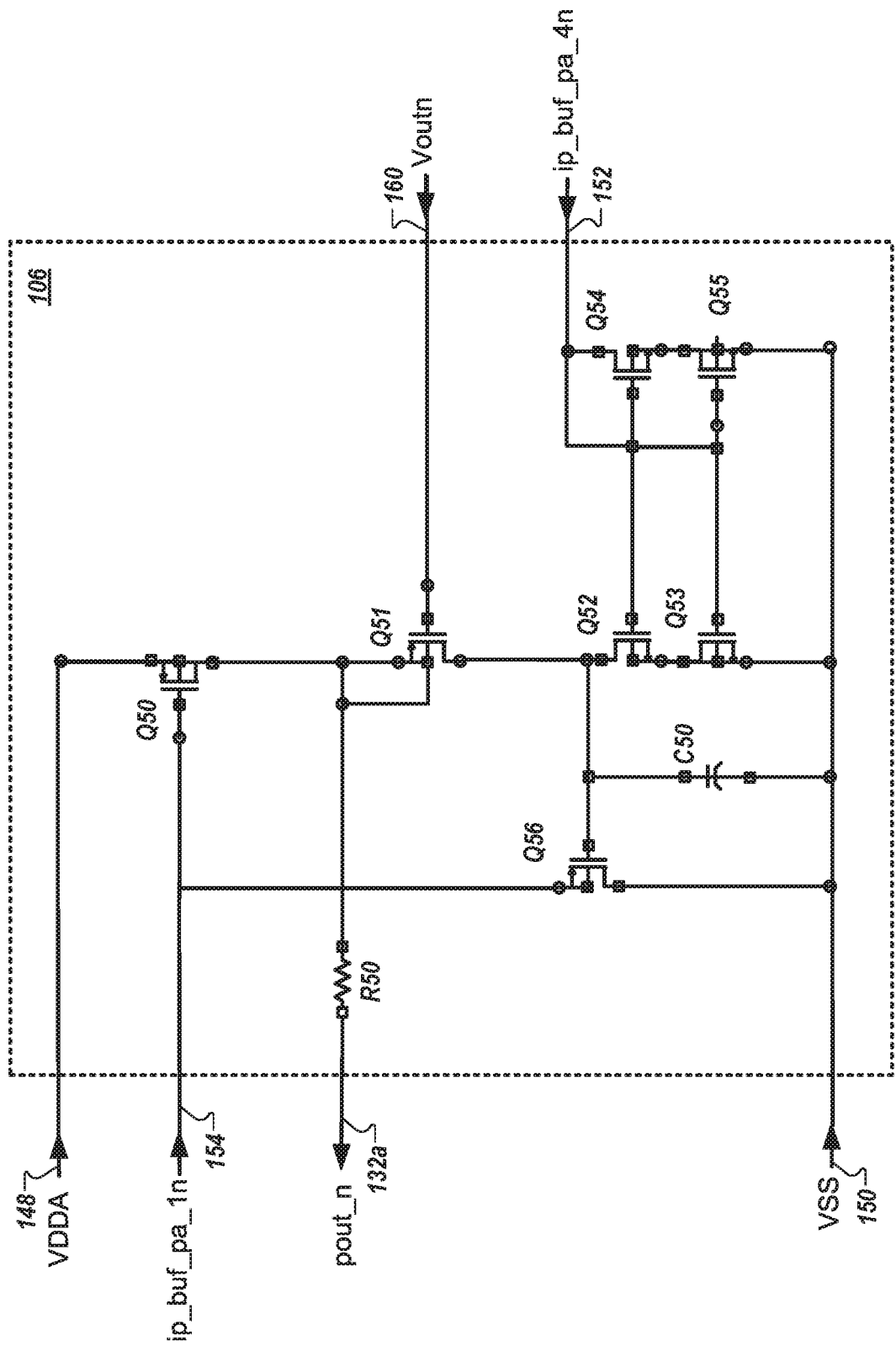
FIG. 5 is a diagram showing example electrical circuitry included in a second circuit included in an output buffer.
Figure 6:
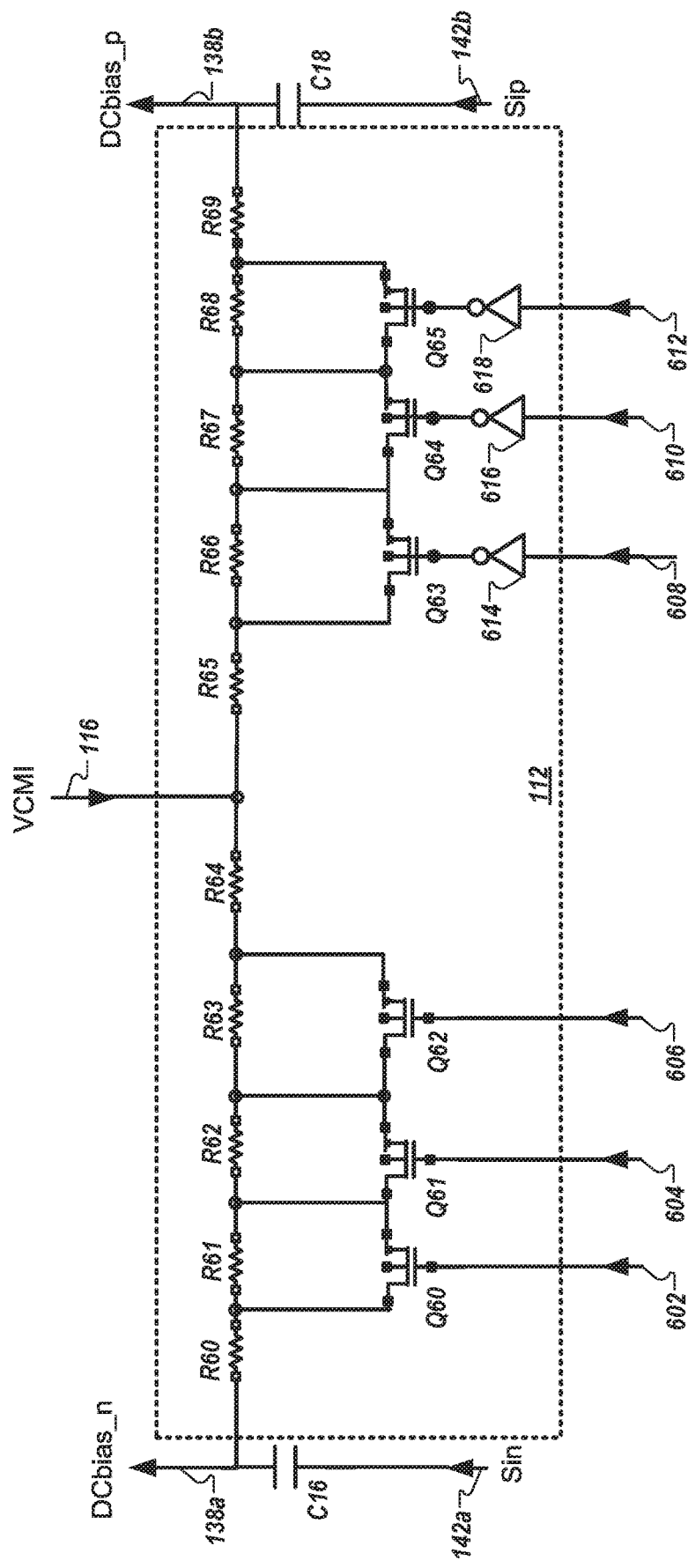
FIG. 6 is a diagram showing example electrical circuitry included in a DC bias module.
Figure 7:
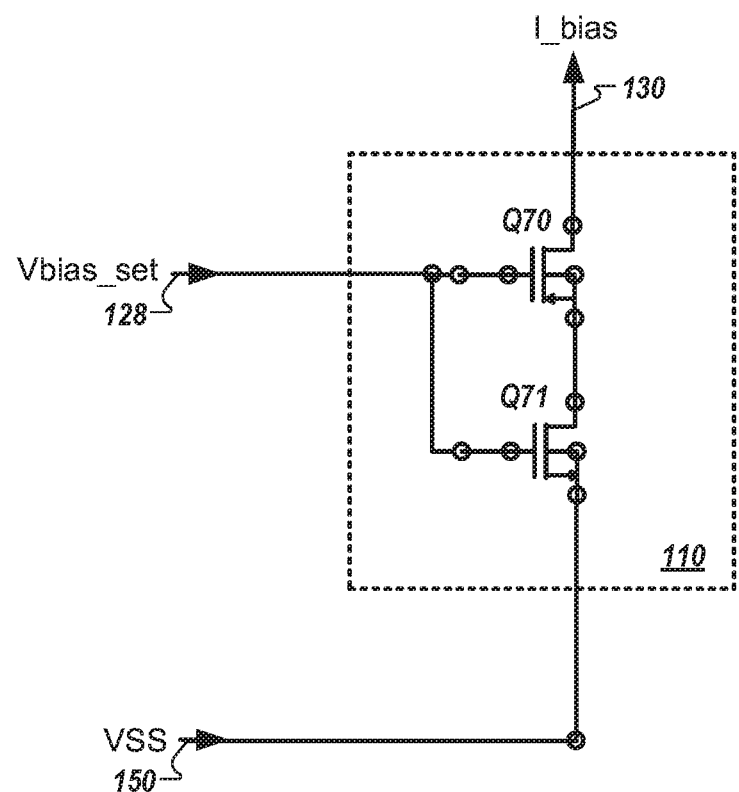
FIG. 7 is a diagram showing example electrical circuitry included in an input bias current module.
Figure 8:
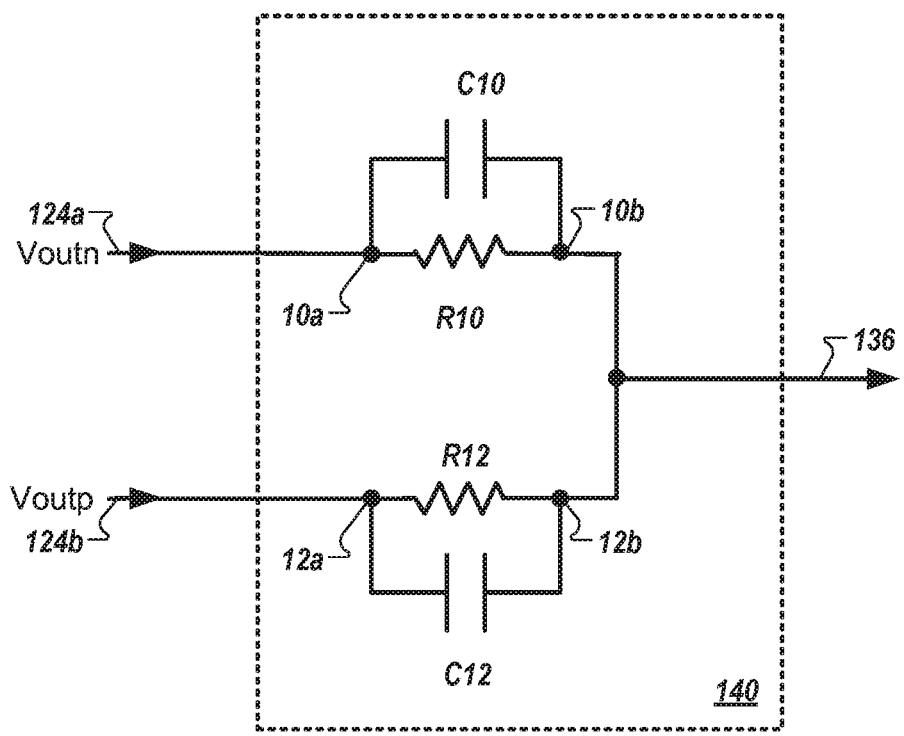
FIG. 8 is a diagram showing example electrical circuitry included in a combining circuit.

FIGS. 3-9 include diagrams showing example electrical circuitry for the circuits, amplifiers, and modules included in FIGS. 1A-B. FIG. 3 is a diagram showing example electrical circuitry for the feedback amplifier 104. FIG. 4 is a diagram showing example electrical circuitry for the second output buffer circuit 108. FIG. 5 is a diagram showing example electrical circuitry for the first output buffer circuit 106. FIG. 6 is a diagram showing example electrical circuitry included in the DC bias module 112. FIG. 7 is a diagram showing example electrical circuitry included in the input bias current module 110. FIG. 8 is a diagram showing example electrical circuitry included in the combining circuit 140. FIG. 9 is a diagram showing example electrical circuitry for the input amplifier 102 that includes example electrical circuitry for the MOS transistor and resistor block 126 and example electrical circuitry for the MOS transistor and resistor block 138.

Figure 2:
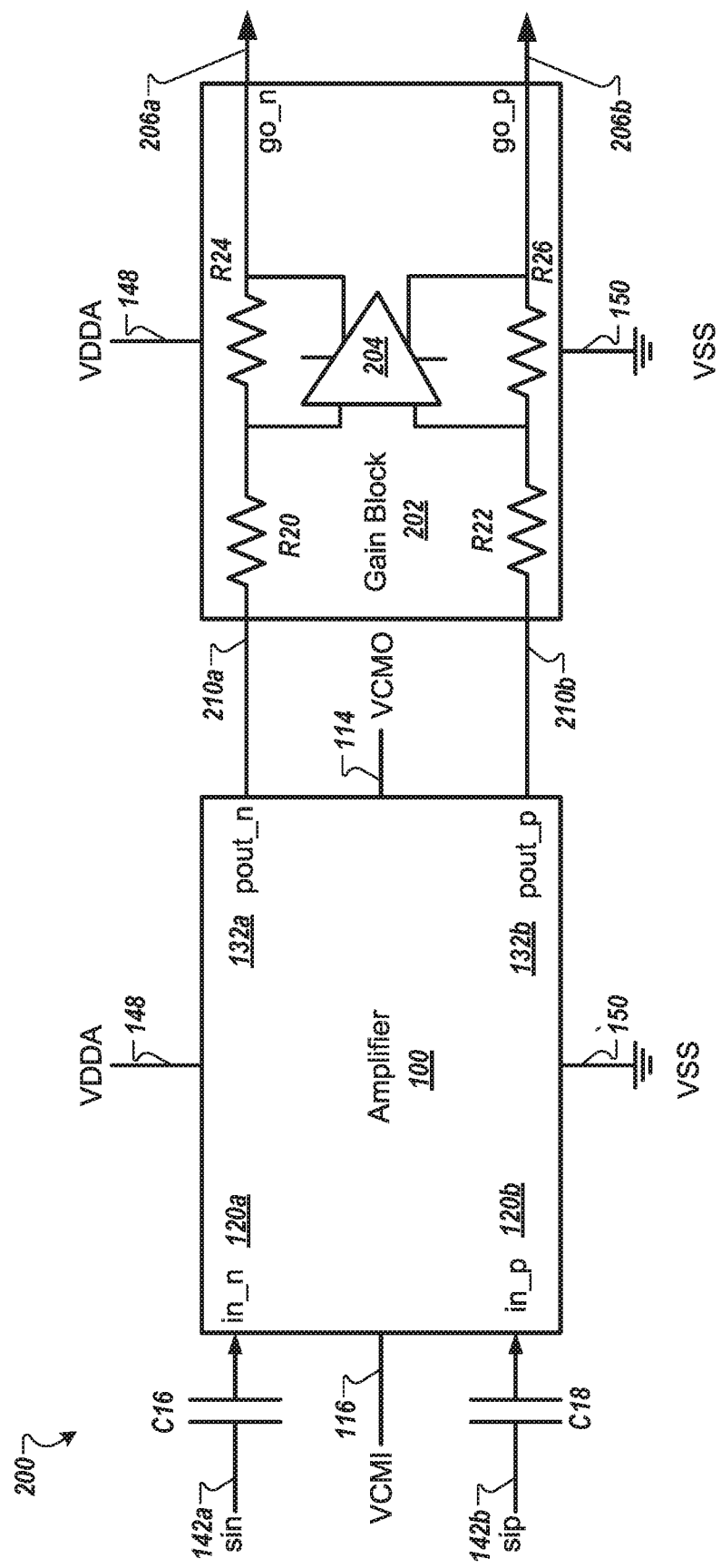
FIG. 2 is a block diagram showing example electrical circuitry that includes an amplifier and a gain block module.

FIG. 2 is a block diagram showing example electrical circuitry 200 that includes an amplifier (e.g., the amplifier 100 as shown in FIG. 1) and a gain block module 202. For example, the amplifier 100 can be a pre-amplifier. The output of the amplifier 100, buffered output differential signal pair 132a-b, can be input to the gain block module 202. The buffered output signal pout_n 132a and the buffered output signal p_outp 132b output by the amplifier 100 can drive a gain block differential input 210a-b (shown as a gain block input 210a and a gain block input 210b, respectively, of the gain block module 202.

The gain block module 202 can provide further gain and amplification of the buffered output differential signal pair 132a-b, resulting in an output differential signal pair 206a-b shown as an output signal go_n 206a and an output signal go_p 206b. Amplifier 204 can amplify the buffered output signal pout_n 132a and the buffered output signal p_outp 132b. Resistor R20 and resistor R24 can control the gain of the amplifier 204 and the amplification provided to the buffered output signal pout_n 132a, resulting in an output signal go_n 206a. Resistor R22 and resistor R26 can control the gain of the amplifier 204 and the amplification provided to the buffered output signal pout_p 132b, resulting in an output signal go_p 206b.

FIG. 3 is a diagram showing example electrical circuitry for a feedback amplifier (e.g., the feedback amplifier 104 as shown in FIGS. 1A-B). The feedback amplifier 104 can be implemented as a common mode amplifier that includes a current mirror (MOS transistors Q34-37), differential inputs (MOS transistors Q30-31), and MOS transistors Q32-33 providing an input reference current 304 to the current mirror. The input signal 302 can drive the MOS transistor Q33 controlling the value of the input reference current 304.

The differential inputs to the feedback amplifier 104 include the output of the combining circuit 140 at the input signal 136 and the second common mode reference voltage Vcmo 114. The output of the combining circuit 140 is the combination or average of the output signal Voutn 124a and the output signal Voutp 124b from the input amplifier 102. The input signal 136 and the second common mode reference voltage Vcmo 114 allow for the adaptive setting of the Vbias_set 128 output which controls the input bias current to the input amplifier 102. The feedback amplifier 104 can control the output signal swing of the output differential signal pair 124a-b in relation to the input bias current. This can provide a constant gain for the input amplifier 102 as the output differential signal pair 124a-b is used for a differential input to the feedback amplifier 104 with the other differential input to the feedback amplifier 104 being a reference voltage (Vcmo 114).

The performance of the feedback amplifier 104 can be optimized by providing a good matching between the MOS transistor Q32 and the MOS transistor Q33. In addition or in the alternative, good matching of the differential input transistors, MOS transistor Q30 to MOS transistor Q31, can also contribute to the optimized performance of the feedback amplifier 104.

FIG. 4 is a diagram showing example electrical circuitry included in a second circuit (e.g., the second output buffer circuit 108 as shown in FIGS. 1A-B) of an output buffer (e.g., the output buffer 134 as shown in FIGS. 1A-B). The second output buffer circuit 108 includes a current mirror (MOS transistors Q42-45). The ip_buff_pa_4n signal 152 and the ip_buff_pa_1n signal 154 are provided to the second output buffer 108 as input signal 156 and input signal 158, respectively. The ip_buff_pa_4n signal 152 provides the reference current for the current mirror (MOS transistors Q42-45). The ip_buff_pa_4n signal 152 and the ip_buff_pa_1n signal 154 along with MOS transistor Q46 and capacitor C40 controls MOS transistor Q40. MOS transistor Q41 is a source follower with low output impedance that can buffer the output signal Voutp 124b. Selecting values for the ip_buff_pa_4n signal 152, the ip_buff_pa_1n signal 154, the capacitor C40, and resistor R40 can determine the output drive capability of the buffered output signal pout_p 132*b*.

As described, the output buffer 134 can be considered a second stage of two stages of the amplifier 100. In the second stage, the second output buffer circuit 108 can be biased such that the amplifier 100 can be classified as a class AB amplifier. As a class AB amplifier, the amplifier 100 is conducting more than half of the input cycle for the amplifier 100. The second output buffer circuit 108 can be biased such that the sinking and sourcing of current provides low total harmonic distortion (THD) of the buffered output signal pout_p 132*b* for large input signal operation. The performance of the second output buffer circuit 108 can be optimized by providing a good matching between the MOS transistor Q44 and the MOS transistor Q45.

FIG. 5 is a diagram showing example electrical circuitry included in a first circuit (e.g., the first output buffer circuit 106 as shown in FIGS. 1A-B) of an output buffer (e.g., the output buffer 134 as shown in FIGS. 1A-B). The first output buffer circuit 106 includes a current mirror (MOS transistors Q52-55). The ip_buff_pa_4n signal 152 and the ip_buff_pa_1n signal 154 are provided to the first output buffer 106 as input signal 153 and input signal 155, respectively. The ip_buff_pa_4n signal 152 provides the reference current for the current mirror (MOS transistors Q52-55). The ip_buff_pa_4 n signal 152 and the ip_buff_pa_1n signal 154 along with MOS transistor Q56 and capacitor C50 controls MOS transistor Q50. MOS transistor Q51 is a source follower with low output impedance that can buffer the output signal Voutn 124*a*. Selecting values for the ip_buff_pa_4 n signal 152, the ip_buff_pa_1n signal 154, the capacitor C50, and resistor R50 can determine the output drive capability of the buffered output signal pout_n 132*a*.

As described, the output buffer 134 can be considered a second stage of two stages of the amplifier 100. In the second stage, the first output buffer circuit 106 can be biased such that the amplifier 100 can be classified as a class AB amplifier. As a class AB amplifier, the amplifier 100 is conducting more than half of the input cycle for the amplifier 100. The first output buffer circuit 106 can be biased such that the sinking and sourcing of current provides low total harmonic distortion (THD) of the buffered output signal pout_n 132*n* for large input signal operation. The performance of the first output buffer circuit 106 can be optimized by providing a good matching between the MOS transistor Q54 and the MOS transistor Q55.

FIG. 6 is a diagram showing example electrical circuitry included in a DC bias module (e.g., the DC bias module 112 as shown in FIGS. 1A-B). MOS transistors Q60-62 can be selectively turned on and off by controlling a gate 602, a gate 604, and a gate 606, respectively, of each MOS transistor Q60-62. The MOS transistors Q60-62 can be selectively turned off, which results in the switching of resistors R61, R62, and R63, respectively, to be included in series with resistor R60 and resistor R64. The MOS transistors Q60-62 can be selectively turned on, which results in the resistors R61, R62, and R63, respectively, not being included in series with resistor R60 and resistor R64. Any combination of the turning on and off of the MOS transistors Q60-62 is allowed. The setting of the total resistance determines the value of the DCbias_n 138*a* voltage.

MOS transistors Q63-65 can be selectively turned on and off by controlling a gate 608, a gate 610, and a gate 612, respectively, of each MOS transistor Q63-65 by controlling a first inverter input 608, a second inverter input 610, and a third inverter input 610, respectively. The MOS transistors Q63-65 can be selectively turned off, which results in the switching of resistors R66, R67, and R68, respectively, to be included in series with resistor R65 and resistor R69. The MOS transistors Q63-65 can be selectively turned on, which results in the resistors R66, R67, and R68, respectively, not being included in series with resistor R65 and resistor R69. Any combination of the turning on and off of the MOS transistors Q63-65 is allowed. The setting of the total resistance determines the value of the high pass frequency corner in conjunction with an external capacitor.

The DC bias module 112 outputs the DC bias differential voltage signal 138*a-b* for use in controlling the DC bias of the input differential signal pair 120*a-b*. The first common mode reference voltage Vcmi 116 is the input reference voltage to the DC bias module 112 providing a reference voltage for the DC bias differential voltage signal 138*a-b*.

The use of two separate common mode input reference voltages (e.g., Vcmi 116 and Vcmo 114) can enable the use of two separate voltages to determine, in part, different electrical characteristics of the amplifier 100. The setting of the two separate common mode input reference voltages (e.g., Vcmi 116 and Vcmo 114) can appropriately enable an overall optimal implementation of the amplifier 100. The use of the two separate common mode input reference voltages (e.g., Vcmi 116 and Vcmo 114) can allow for independent control and optimization of the parameters described herein with reference to Equations 1, 2A-B, 3A-B, and 4A-B when achieving the overall optimal implementation of the amplifier 100.

An input common mode range for the amplifier 100 can be controlled and/or maximized based on the selection of the voltage value for the first common mode reference voltage Vcmi 116. For example, in low voltage implementations of the amplifier 100, the value of the voltage Vcmi 116 can be optimized in the design stage of the amplifier 100 or when measuring the amplifier 100.

Large common mode signals can be present in electronic medical devices that can be worn by and/or implanted in a person. The large common mode signal, if it is within the input common mode range for the amplifier 100, can be attenuated by the amplifier 100, and in particular by the common mode feedback circuit described herein that includes the combining circuit 140, the feedback amplifier 104, the input amplifier 102, the input bias current module 110, and the DC bias module 112. For example, a differential signal of interest (e.g., the input differential signal pair 120*a-b*) can have a voltage value in the range of tens of microvolts while the common mode signal that needs to be suppressed can be several orders of magnitude higher than the tens of microvolts. Therefore, it is desirable for the amplifier 100 to have low noise and process (i.e., apply gain) on differential signals (e.g., differential signals on the order of tens of microvolts) while at the same time being able to suppress a much higher common mode signal.

A value for an output common mode voltage (e.g., the second common mode reference voltage Vcmo 114) can be determined or set by a process similar the process used for determining or setting a voltage value for the first common mode reference voltage Vcmi 116. The voltage value for the output common mode voltage (e.g., the second common mode reference voltage Vcmo 114) can be determined or set based on achieving a target gain for the amplifier 100 and based on optimizing or maximizing the signal swing of the output differential signal pair 124*a-b*. The setting of the first common mode reference voltage Vcmi 116 and the second common mode reference voltage Vcmo 114 as described herein can be an interdependent and iterative process to provide an optimum implementation of amplifier 100.

The resistors R60-64 in conjunction capacitor 16 can set a high pass filter frequency for the input signal in_n 120a for the input amplifier 102. The value of the high pass filter frequency can be adjusted (changed, moved) by any combination of selectively turning on and off of the MOS transistors Q60-62, which results in selectively including or omitting resistors R61-63 from being included in series with resistor R60 and resistor R64. The resistors R65-69 in conjunction capacitor 18 can set a high pass filter frequency for the input signal in_p 120b for the input amplifier 102. The value of the high pass filter frequency can be adjusted (changed, moved) by any combination of selectively turning on and off of the MOS transistors Q63-65, which results in selectively including or omitting resistors R66-68 from being included in series with resistor R65 and resistor R69.

FIG. 7 is a diagram showing example electrical circuitry included in an input bias current module (e.g., the input bias current module 110 as shown in FIGS. 1A-B). The Vbias_set 128 input signal voltage is input to the gate of MOS transistor Q70 and is input to the gate of MOS transistor Q71. The drive provided to the MOS transistor Q70 and the MOS transistor Q71 by the Vbias_set 128 input signal voltage determines the value of the output I_bias 130, which controls the bias current for the input amplifier 102.

FIG. 8 is a diagram showing example electrical circuitry included in a combining circuit (e.g., the combining circuit 140 as shown in FIGS. 1A-B). The combining circuit 140 includes a resistor R10 and a capacitor C10 connected in parallel. The output signal Voutn 124a is connected to a first side 10a of the parallel connection of resistor R10 and capacitor C10. The combining circuit 140 further includes a resistor R12 and a capacitor C12 connected in parallel. The output signal Voutp 124b is connected to a first side 12a of the parallel connection of resistor R12 and capacitor C12. A second side 10b of the parallel connection of resistor R10 and capacitor C10 is connected to a second side 12b of the parallel connection of resistor R12 and capacitor C12 to create the combination, average, or midpoint of the output signal Voutn 124a and the output signal Voutp 124b as the input signal 136.

FIG. 9 is a diagram showing example electrical circuitry 900 for an input amplifier (e.g., the input amplifier 102 as shown in FIGS. 1A-B). The input differential signal pair 120a-b, shown as input signal in_n 120a and input signal in_p 120b, is input to the input amplifier 102. The output differential signal pair 124a-b shown as the output signal Voutn 124a and the output signal Voutp 124b is output from the input amplifier 102.

The I_bias 130 output from the input bias current module 110 controls the bias current for the differential input stage of the input amplifier 102. For example, a design goal for the input amplifier 102 can be for a voltage value for the output signal Voutn 124a and the output signal Voutp 124b to be approximately equal to one half of the regulated supply voltage VDDA 148. The gain of the amplifier 100 can therefore be proportional to the regulated supply voltage VDDA 148 and can be a fixed gain as the voltage VDAA 148 is a regulated voltage. Maintaining a voltage across the resistors R90-92 constant and maintaining a voltage across the resistors R93-95 constant can eliminate a dependency on a supply voltage. Using a regulated supply voltage as the input voltage to each series resistor network (resistors R90-02 connected in series and R93-95 connected in series) can result in a fixed gain output for the amplifier 100.

Each MOS transistor Q90-92 can switch a respective resistor R90-92 in and out of the series of resistors R90-92, controlling the current flow through the series of resistors R90-92, through a resistor R96, and into the MOS transistor Q97. Each MOS transistor Q93-95 can switch a respective resistor R93-95 in and out of the series of resistors R93-95, controlling the current flow through the series of resistors R93-95, through a resistor R97, and into the MOS transistor Q96.

The MOS transistors Q90-92 can be selectively turned on and off by controlling a gate 902, a gate 904, and a gate 906, respectively, of each MOS transistor Q90-92. The MOS transistors Q90-92 can be selectively turned off, which results in the switching of resistors R90, R91, and R92, respectively, to be included in series with resistor R96. The MOS transistors Q90-92 can be selectively turned on, which results in the resistors R90, R91, and R92, respectively, not being included in series with resistor R96. Any combination of the turning on and off of the MOS transistors Q90-92 is allowed. The setting of the total resistance determines the value of a current $I_{Dn}$ 914 into the drain of the MOS transistor Q97.

The MOS transistors Q93-95 can be selectively turned on and off by controlling a gate 908, a gate 910, and a gate 912, respectively, of each MOS transistor Q93-95. The MOS transistors Q93-95 can be selectively turned off, which results in the switching of resistors R93, R94, and R95, respectively, to be included in series with resistor R97. The MOS transistors Q93-95 can be selectively turned on, which results in the resistors R93, R94, and R95, respectively, not being included in series with resistor R97. Any combination of the turning on and off of the MOS transistors Q93-95 is allowed. The setting of the total resistance determines the value of a drain current $I_{Dp}$ 916 into the drain of the MOS transistor Q96. The common modes rejection ratio of the input amplifier 102 can be limited by closely matching the resistor R97 and the resistor R96.

The input amplifier 102 can be biased in a sub-threshold region of operation when the MOS transistor Q97 and the MOS transistor Q96 operate in a weak inversion or sub-threshold region. In order for the MOS transistor Q97 and the MOS transistor Q96 to operate in a weak inversion or subthreshold region, the gate-to-source voltage for the MOS transistor Q97 and for the MOS transistor Q96 is maintained below a threshold voltage. Therefore, the respective transconductance (gm) for the MOS transistor Q97 and for the MOS transistor Q96 can be a function of a drain current of the respective MOS transistor Q97 and the MOS transistor Q96, drain current $I_{Dn}$ 914 and Drain current $I_{Dp}$ 916, respectively.

In general, the transconductance for a MOS transistor is an expression of the performance of the MOS transistor and is measured in siemens. For example, the larger the transconductance the greater the gain a MOS transistor is configured to deliver.

Equations 1, 2A-B, 3A-B, and 4A-B show examples relationships that can be used to determine (calculate) the gain of the input amplifier 102 for the output differential signal pair 124a-b. The Equations 1, 2A-B, 3A-B, and 4A-B show the gain for the output signal Voutn 124a and the output signal Voutp 124b is dependent on the regulated supply voltage VDDA 148, the respective output signal, and a MOS transistor gate voltage.

Equation 1 represents a relationship for determining the transconductance (GM(n,p)) for the MOS transistor Q96 and for the MOS transistor Q97.

$$GM(n, p) = \frac{I_{Dn}}{nVt} \qquad \text{EQUATION 1}$$

For the MOS transistor Q97, $I_{Dn}$ is the drain current $I_{Dn}$ 914, n is the subthreshold slope parameter, and Vt is the thermal voltage (kT/q), which, for example, can be equal to approximately 25.8 mV.

For the MOS transistor Q96, $I_{Dn}$ is the drain current $I_{Dn}$ 916, n is the subthreshold slope parameter, and Vt is the thermal voltage (kT/q), which, for example, can be equal to approximately 25.8 mV.

Equation 2A represents a relationship for calculating the drain current $I_{Dn}$ 914.

$$I_{Dn} = \frac{VDDA - Voutn}{Rn} \qquad \text{EQUATION 2A}$$

where VDDA is the regulated supply voltage VDDA 148, Voutn is the output signal Voutn 124a, and Rn=R96+the sum of R90 to R92 which is dependent on which of the resistors R90-92 are switched in series with R96.

Equation 2B represents a relationship for calculating the drain current $I_{Dp}$ 916.

$$I_{Dp} = \frac{VDDA - Voutp}{Rp} \qquad \text{EQUATION 2B}$$

where VDDA is the regulated supply voltage VDDA 148, Voutp is the output signal Voutp 124b, and Rp=R97+the sum of R93 to R95 which is dependent on which of the resistors R93-95 are switched in series with R97.

Equation 3A represents a relationship for calculating the gain of the input amplifier 102 for the output signal Voutn 124a.

$$\text{Gain}(Voutn) = GM(n) \times Rn \qquad \text{EQUATION 3A}$$

where the GM(n) transconductance (GM(n)) is for the MOS transistor Q97, and Rn=R96+the sum of R90 to R92 which is dependent on which of the resistors R90-92 are switched in series with R96.

Equation 3B represents a relationship for calculating the gain of the input amplifier 102 for the output signal Voutp 124b.

$$\text{Gain}(Voutp) = GM(p) \times Rp \qquad \text{EQUATION 3B}$$

where the GM(p) transconductance (GM(p)) is for the MOS transistor Q96, and Rp=R97+the sum of R93 to R95 which is dependent on which of the resistors R93-95 are switched in series with R97.

Equation 4A represents a relationship for calculating the gain of the input amplifier 102 for the output signal Voutn 124a using Equation 1A, Equation 2A, and Equation 3A.

$$\text{Gain}(Voutn) = \left(\frac{VDDA - Voutn}{nVt \times Rn}\right) \times Rn = \frac{VDDA - Voutn}{nVt} \qquad \text{EQUATION 4A}$$

where VDDA is the regulated supply voltage VDDA 148, Voutn is the output signal Voutn 124a, n is the subthreshold slope parameter, Vt is the thermal voltage (kT/q), and Rn=R96+the sum of R90 to R92 which is dependent on which of the resistors R90-92 are switched in series with R96.

Equation 4B represents a relationship for calculating the gain of the input amplifier 102 for the output signal Voutp 124b using Equation 1B, Equation 2B, and Equation 3B.

$$\text{Gain}(Voutp) = \left(\frac{VDDA - Voutp}{nVt \times RP}\right) \times Rn = \frac{VDDA - Voutp}{pVt} \qquad \text{EQUATION 4B}$$

where VDDA is the regulated supply voltage VDDA 148, Voutp is the output signal Voutp 124b, n is the subthreshold slope parameter, Vt is the thermal voltage (kT/q), and Rp=R97+the sum of R93 to R95 which is dependent on which of the resistors R93-95 are switched in series with R97.

As shown by Equation 4A and Equation 4B, the gain for the input amplifier 102 can be dependent on the regulated supply voltage VDDA 148, the output signal Voutn 124a level, and the output signal Voutp 124b level. The use of a common mode feedback circuit (e.g., the feedback amplifier 104, the combining circuit 140, and the input bias current module 110) can ensure the output signal Voutn 124a and the output signal Voutp 124b are maintained at a constant level. The combination of the constant levels for the output signal Voutn 124a and the output signal Voutp 124b along with the use of a regulated power supply providing the regulated supply voltage VDDA 148 allows the input amplifier 102 to provide a constant gain.

In some cases, there can be a trade-off between current and noise when determining values for the drain current $I_{Dn}$ 914 and the drain current $I_{Dp}$ 916. For example, the larger the drain current the more noise that may be introduced into the output signals (the output signal Voutn 124a and the output signal Voutp 124b) of the input amplifier 102. For example, when the drain current is hundreds of nanoamps, the integrated input referred noise can be less than one uVrms in a bandwidth in the order of less than 100 hertz across process and temperature characteristics of the amplifier. In this example, referring to FIG. 9, the gain of the amplifier 100 can vary below 1 dB across a full range of three bits of control for the inputs to the gate 908, the gate 910, and the gate 912, respectively, of each MOS transistor Q93-95, and for three bits of control for the gate 902, the gate 904, and the gate 906, respectively, of each MOS transistor Q90-92.

Figure 10:
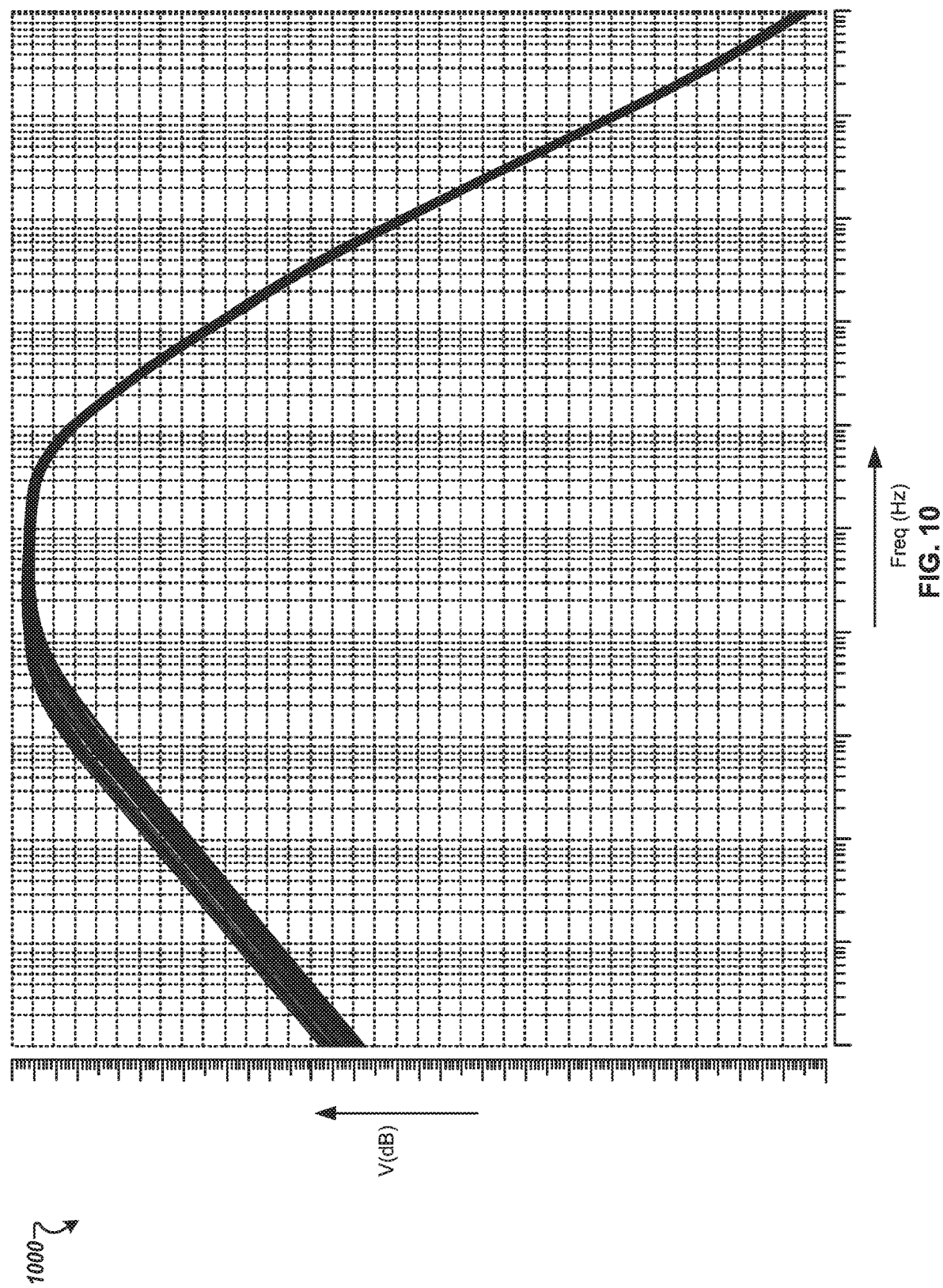
FIG. 10 is an example graph showing an output voltage versus frequency where the frequency is a high pass filter frequency controlled by a high pass filter using a capacitor external to a DC bias module.

FIG. 10 is an example graph 1000 showing an output voltage (in dB) versus frequency (in Hz.). The frequency is a high pass filter frequency controlled by a high pass filter using a capacitor (e.g., the capacitor C16, the capacitor C18) external to a DC bias module (e.g., the DC bias module 112).

Figure 11:
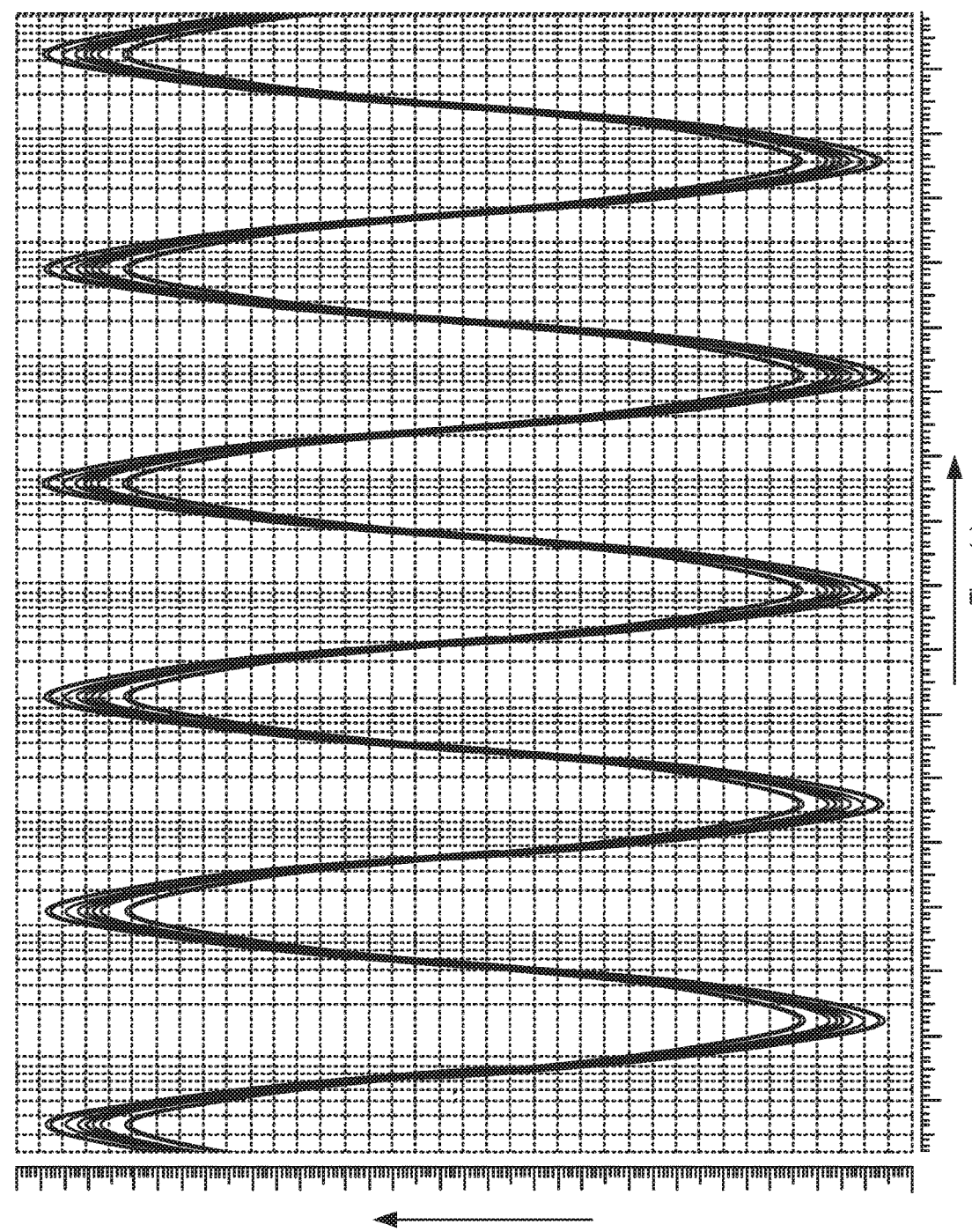
FIG. 11 is an example graph showing DC bias voltage over time at a particular high pass filter frequency.

FIG. 11 is an example graph 1100 showing a DC bias voltage over time at a particular high pass filter frequency.

Figure 12:
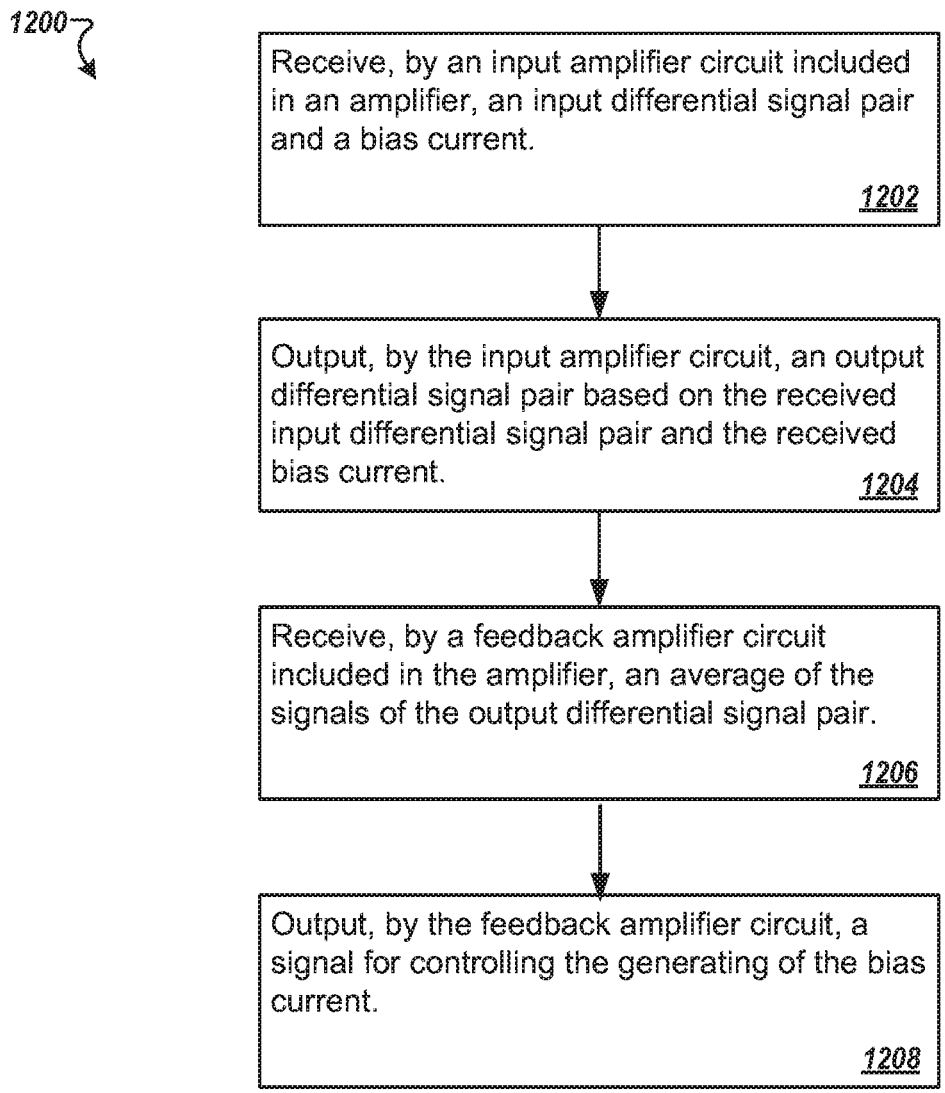
FIG. 12 is a flowchart that illustrates an example method for providing low noise differential amplification for signals used in body worn electronics.

FIG. 12 is a flowchart that illustrates an example method 1200 for providing low noise differential amplification for signals used in body worn electronics. In some implementations, the circuits, devices, systems, and processes described herein can implement the method 1200. For example, the method 1200 can be described referring to FIGS. 1A-B and FIGS. 2-9.

An input differential signal pair and a bias current are received by an input amplifier circuit included in an amplifier (block 1202). For example, referring to FIG. 1B, the input amplifier 102 receives the input differential signal pair 120a-b shown as the input signal in_n 120a and the input signal in_p 120b. The input amplifier 102 receives the output (e.g., I_bias 130) of the input bias current module 110 that controls the bias current for the input amplifier 102.

An output differential signal pair is output by the input amplifier circuit based on the received input differential signal pair and the received bias current (block 1204). For example, the input amplifier outputs the output differential signal pair 124a-b shown as the output signal Voutn 124a and the output signal Voutp 124b.

An average, combination, or midpoint of the signals of the output differential signal pair is received by a feedback amplifier circuit included in the amplifier (block 1206). For example, the combining circuit 140 provides the input signal 136 to the feedback amplifier 104 as an average of the output signal Voutn 124a and output signal Voutp 124b.

A signal for controlling the generating of the bias current is output by the feedback amplifier circuit (block 1208). For example, the output 146 of the feedback amplifier 104 controls the input to the input bias current module 110 (e.g., the Vbias_set 128).

The metal oxide semiconductor (MOS) transistors described herein can be implemented as P-channel or N-channel devices. The MOS transistors described herein can be implemented as depletion mode or enhancement mode devices. The MpOS transistors described herein can be implemented as junction field effect transistors (JFETs) or metal oxide semiconductor field effect transistors (MOSFETs), It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A pre-amplifier comprising:
   a first stage including:
      a feedback amplifier circuit configured to control an output voltage swing of an output differential signal pair in relation to a bias current by providing a constant output voltage signal gain for the output differential signal pair;
      an input amplifier circuit configured to receive the bias current and configured to receive, as an input, an input differential signal pair connected differentially to the input amplifier circuit through a blocking capacitor, the input amplifier circuit configured to output the output differential signal pair based on the input differential signal pair and the bias current, the input amplifier circuit including a transistor and resistor block controllable to switch output load resistors to the input amplifier circuit; and
   a second stage including:
      a buffer circuit configured to amplify an output signal of the output differential signal pair to generate a buffered output signal configured to drive a resistive load included in a gain module.

2. The pre-amplifier of claim 1, further comprising a DC bias module configured to set a high pass filter frequency for the pre-amplifier.

3. The pre-amplifier of claim 2, wherein the DC bias module includes a plurality of resistors and a plurality of metal oxide semiconductor (MOS) transistors controlling the plurality of resistors for setting a DC bias for the input differential signal pair.

4. The pre-amplifier of claim 2, wherein the high pass filter frequency is further based on a value of the blocking capacitor.

5. The pre-amplifier of claim 2, wherein the feedback amplifier circuit is a common mode feedback circuit, the feedback amplifier circuit has an input voltage that is a second common mode reference voltage and the DC bias module has an input voltage that is a first common mode reference voltage.

6. The pre-amplifier of claim 5, wherein a value of the first common mode reference voltage and a value of the second common mode reference voltage are set in order to control an input common mode range for the pre-amplifier.

7. The pre-amplifier of claim 1, wherein the transistor and resistor block includes a plurality of metal oxide semiconductor (MOS) transistors to control a switching of output load resistors to the input amplifier circuit, the output load resistors have a value determining a magnitude of current for consumption by the input amplifier circuit, and the magnitude of current consumed determines a level of noise in the pre-amplifier.

8. The pre-amplifier of claim 7, wherein the pre-amplifier has a common mode gain that is determined based on a matching of the output load resistors.

9. The pre-amplifier of claim 1, wherein the feedback amplifier circuit has an input that is a combination of a first output signal voltage of the output differential signal pair and a second output signal voltage of the output differential signal pair.

10. The pre-amplifier of claim 9, further comprising an input bias current module configured to generate the bias current and provide the bias current to the input amplifier circuit, the feedback amplifier circuit having an output controlling the generating of the bias current by the input bias current module.

11. An amplifier comprising:
a feedback amplifier circuit configured to control an output voltage swing of an output differential signal pair in relation to a bias current by providing a constant output voltage signal gain for the output differential signal pair;
an input amplifier circuit configured to receive the bias current and configured to receive, as an input, an input differential signal pair connected differentially to the input amplifier circuit through a pair of capacitors, the input amplifier circuit configured to output the output differential signal pair based on the input differential signal pair and the bias current;
a DC bias module coupled between the pair of capacitors and the input amplifier circuit and configured to control a high pass filter frequency of the amplifier; and
an output buffer including a first buffer circuit and a second buffer circuit, the first buffer circuit configured to amplify a first output signal of the output differential signal pair to generate a first buffered output signal configured to drive a first resistive load, the second buffer circuit configured to amplify a second output signal of the output differential signal pair to generate a second buffered output signal configured to drive a second resistive load.

12. The amplifier of claim 11, wherein the DC bias module includes a plurality of resistors and a plurality of metal oxide semiconductor (MOS) transistors controlling the plurality of resistors for setting a DC bias for the input differential signal pair.

13. The amplifier of claim 11, wherein the high pass filter frequency is further based on a value of the pair of capacitors.

14. The amplifier of claim 11, wherein the feedback amplifier circuit is a common mode feedback circuit, the feedback amplifier circuit has an input voltage that is a second common mode reference voltage and the DC bias module has an input voltage that is a first common mode reference voltage.

15. The amplifier of claim 14, wherein a value of the first common mode reference voltage and a value of the second common mode reference voltage are set in order to control an input common mode range for the amplifier.

16. The amplifier of claim 11, wherein the amplifier is a pre-amplifier having a first stage that includes the feedback amplifier circuit and the input amplifier circuit, and having a second stage that includes the output buffer, and the first resistive load and the second resistive load are included in a gain module.

17. The amplifier of claim 11, wherein the input amplifier circuit includes a transistor and resistor block controllable to switch output load resistors to the input amplifier circuit, the transistor and resistor block including a plurality of metal oxide semiconductor (MOS) transistors configured to control a switching of output load resistors to the input amplifier circuit, the output load resistors have a value determining a magnitude of current for consumption by the input amplifier circuit, and the magnitude of current consumed determines a level of noise in the amplifier.

18. The amplifier of claim 17, wherein the amplifier has a common mode gain that is determined based on a matching of the output load resistors.

19. The amplifier of claim 11, wherein the feedback amplifier circuit has an input that is a combination of a first output signal voltage of the output differential signal pair and a second output signal voltage of the output differential signal pair.

20. The amplifier of claim 11, further comprising an input bias current module configured to generate the bias current and provide the bias current to the input amplifier circuit, the feedback amplifier circuit having an output controlling the generating of the bias current by the input bias current module.

* * * * *